(12) United States Patent
Hastings

(10) Patent No.: US 7,592,859 B2
(45) Date of Patent: Sep. 22, 2009

(54) APPARATUS TO COMPARE AN INPUT VOLTAGE WITH A THRESHOLD VOLTAGE

(75) Inventor: Roy Alan Hastings, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 25 days.

(21) Appl. No.: 11/725,278

(22) Filed: Mar. 19, 2007

(65) Prior Publication Data
US 2008/0157820 A1 Jul. 3, 2008

Related U.S. Application Data

(60) Provisional application No. 60/877,716, filed on Dec. 28, 2006.

(51) Int. Cl.
*G05F 1/10* (2006.01)
*G05F 3/16* (2006.01)
(52) U.S. Cl. .................. 327/539; 327/513; 323/313
(58) Field of Classification Search .............. 327/538, 327/539, 513; 323/315, 316, 313
See application file for complete search history.

(56) References Cited

U.S. PATENT DOCUMENTS

| | | | | |
|---|---|---|---|---|
| 5,440,224 A | * | 8/1995 | Kimura | 323/313 |
| 5,780,921 A | * | 7/1998 | Mitsuishi | 257/578 |
| 5,926,062 A | * | 7/1999 | Kuroda | 327/538 |
| 6,384,670 B1 | | 5/2002 | Eagar et al. | |
| 6,528,979 B2 | * | 3/2003 | Kimura | 323/313 |
| 6,885,224 B2 | | 4/2005 | Hastings | |
| 2003/0197531 A1 | | 10/2003 | Hastings | |

OTHER PUBLICATIONS

Robert J. Widlar, "New Developments in IC Voltage Regulators", IEEE Journal of Solid-State Circuits, vol. SC-6, No. 1, Feb. 1971, 6 pages.
TPS2410 Data Sheet, downloaded on Mar. 23, 2007, from http://focus.ti.com/docs/prod/folders/print/tps2410.html, 2 sheets.
"Answers.com Widlar current source", downloaded on Dec. 14, 2006, from http://www.answers.com/topic/widlar-current-source, 3 pages.

* cited by examiner

*Primary Examiner*—Dinh T. Le
(74) *Attorney, Agent, or Firm*—John J. Patti; Wade J. Brady, III; Frederick J. Telecky, Jr.

(57) ABSTRACT

Apparatus to compare an input signal to a threshold level are disclosed. An example circuit described herein includes a Widlar bandgap circuit to receive the input signal, an intermediate stage coupled with the output of the Widlar bandgap circuit, and a final stage coupled with the output of the intermediate stage, the final stage to provide an output based on the input signal and the threshold level.

8 Claims, 1 Drawing Sheet

APPARATUS TO COMPARE AN INPUT VOLTAGE WITH A THRESHOLD VOLTAGE

RELATED APPLICATION

This application claims priority from U.S. provisional application Ser. No. 60/877,716 filed Dec. 28, 2006, which is hereby incorporated by reference in its entirety.

FIELD OF THE DISCLOSURE

This disclosure relates generally to analog devices and, more particularly, to apparatus to compare an input voltage with a threshold voltage.

BACKGROUND

A voltage comparator circuit compares a first input voltage to a second input voltage and outputs a signal indicative of the results of the comparison. For example, when the first input voltage exceeds the second input voltage the comparator circuit may output a logical high signal. Conversely, when the first input voltage does not exceed the second input voltage, the comparator circuit may output a logical low signal. In some implementations, the second input voltage may be a reference voltage (e.g., the voltage comparator circuit only has one varying input voltage that is compared to the reference voltage). For example, the reference voltage may be an output of a bandgap reference circuit. A bandgap reference circuit provides a temperature-independent reference voltage that is typically around 1.25 volts. To provide reliable comparator performance, a comparator circuit having a bandgap reference voltage of about 1.25 volts has a minimum operating voltage of about 1.4 volts.

DETAILED DESCRIPTION

Figure 1:
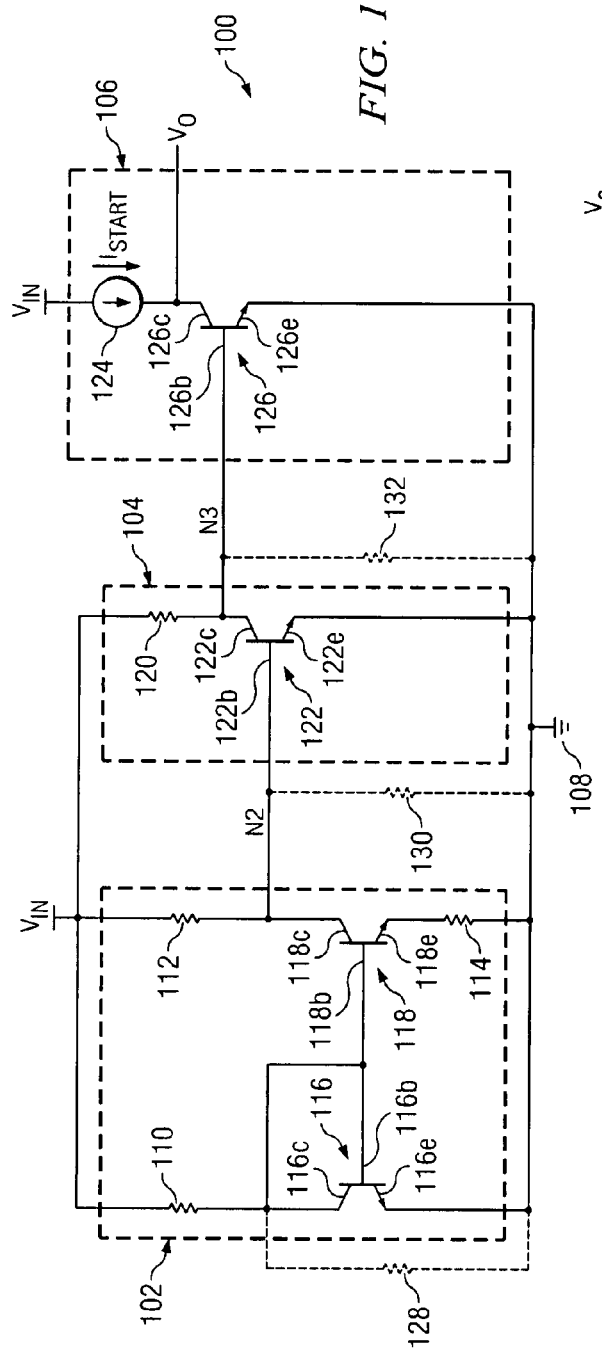
FIG. 1 is an electrical schematic diagram of an example implementation of a comparator apparatus.

FIG. 1 is an electrical schematic diagram of an example implementation of a comparator apparatus 100. The example comparator apparatus 100 includes a first stage 102, an intermediate stage 104, and a final stage 106, each of which connects to a ground voltage potential 108. The example comparator apparatus 100 receives an input voltage $V_{IN}$ and generates an output voltage $V_O$. The output voltage remains at a low value while the input voltage $V_{IN}$ is less than a threshold voltage $V_{th}$. When $V_{IN}$ exceeds $V_{th}$, output voltage $V_O$ rises to approximately equal $V_{IN}$.

The first stage 102 of the illustrated example is a Widlar bandgap circuit that supplies a current signal to the intermediate stage 104 based on input voltage $V_{IN}$. No current is supplied to the intermediate stage while $V_{IN} \leq V_{th}$. When $V_{IN} > V_{th}$, a current flows from the first stage 102 into the intermediate stage 104.

First stage 102 of the illustrated example is implemented using a first impedance 110, a second impedance 112, a third impedance 114, a first transistor 116, and a second transistor 118.

First impedance 110 connects between input voltage $V_{IN}$ and a collector 116c of first transistor 116, which also connects to a base 116b of first transistor 116 and a base 118b of second transistor 118. The second impedance 112 connects between input voltage $V_{IN}$ and collector 118c of second transistor 118, which also connects to intermediate stage 104 at node N2. Third impedance 114 connects between an emitter 118e of second transistor 118 and ground voltage potential 108. First impedance 110, second impedance 112, and third impedance 114 of the illustrated example are resistors. However, as will be appreciated by those having ordinary skill in the art, other impedances may be used in alternative implementations.

First transistor 116 includes collector 116c, base 116b, and an emitter 116e. As previously described, collector 116c connects to base 116b and base 118b. Base 116b connects to collector 116c and base 118b of second transistor 118. Emitter 116e connects to ground voltage potential 108. In the illustrated example, first transistor 116 is an NPN bipolar junction transistor. Alternatively, first transistor 116 may comprise a PNP bipolar junction transistor.

Second transistor 118 includes collector 118c, base 118b, and emitter 118e. As previously described, collector 118c connects to second impedance 112 and intermediate stage 104 at node N2. Base 118b connects to base 116b of first transistor 116. Emitter 118e connects to third impedance 114. In the illustrated example, second transistor 118 is an NPN bipolar junction transistor. Alternatively, second transistor 118 may comprise a PNP bipolar junction transistor.

The intermediate stage 104 of the illustrated example is a common-emitter amplifier. The example intermediate stage 104 receives the current signal from first stage 102 at node N2 and outputs a current signal to final stage 106 at node N3. Intermediate stage 104 sources an appreciable current to final stage 106 only when first stage 102 fails to source appreciable current to intermediate stage 104.

Intermediate stage 104 of the illustrated example includes a fourth impedance 120 and a third transistor 122. Fourth impedance 120 connects between input voltage $V_{IN}$ and node N3, to which a collector 122c of third transistor 122 also connects. Fourth impedance 120 of the illustrated example is shown as a resistor; however, other impedances may be used in alternative implementations.

Third transistor 122 includes collector 122c, a base 122b, and an emitter 122e. As previously described, collector 122c connects to fourth impedance 120 and node N3. Base 122b connects to first stage 102 at node N2. Emitter 122e connects to ground voltage potential 108. In the illustrated example, the third transistor 122 sinks the current flowing through the fourth impedance 120 to ground when an appreciable current signal is received from the first stage 102. The example third transistor 122 is an NPN bipolar junction transistor. Alternatively, third transistor 122 may comprise a PNP bipolar junction transistor.

The final stage 106 of the illustrated example is a transistor switch. The example final stage 106 connects to node N3 and generates an output voltage $V_O$ for the comparator apparatus 100. The output voltage $V_O$ substantially equals $V_{IN}$ when the final stage receives no current from intermediate stage 104 at node N3. The output voltage $V_O$ drops to a low value when the final stage receives appreciable current from intermediate stage 104.

Final stage 106 of the illustrated example includes a current source 124 and a fourth transistor 126. Current source 124 serves as a load for fourth transistor 126 and provides output current for comparator apparatus 100. Current source 124 can be implemented as a depletion-mode field-effect transistor (FET), a junction field-effect transistor (JFET), or any other element operable to restrict current. Current source 124 may not be necessary in all implementations of comparator 100.

Fourth transistor 126 includes collector 126c, a base 126b, and an emitter 126c. As previously described, collector 126c connects to current source 124 and provides output voltage $V_O$. Base 126b connects to intermediate stage 104 at node N3. Emitter 126e connects to ground voltage potential 108. In the illustrated example, the fourth transistor 126 sinks the current from current source 124 to the ground voltage potential 108 when the final stage 106 receives an appreciable current signal from the intermediate stage 104. The example fourth transistor 126 is an NPN bipolar junction transistor. Alternatively, fourth transistor 126 may comprise a PNP bipolar junction transistor.

The threshold voltage $V_{th}$ for comparator apparatus 100 of the illustrated example approximately equals $$V_{th} = V_{be122} + \frac{R_{112}}{R_{114}} V_T \ln\left(\frac{A_{E118} R_{112}}{A_{E116} R_{110}}\right), \quad [1]$$

where $V_{be122}$ equals the voltage drop between base 122b and emitter 122e of third transistor 122, $R_{110}$ is the resistance of first impedance 110, $R_{112}$ is the resistance of second impedance 112, $R_{114}$ is the impedance of third impedance 114, $A_{E116}$ is the emitter area of first transistor 116, $A_{E118}$ is the emitter area of second transistor 118, and $V_T$ is the thermal voltage, which equals Boltzmann's constant k times the charge on the electron q divided by the absolute temperature T, or $V_T = kT/q$.

When $V_{IN}$ equals the threshold voltage $V_{th}$, first transistor 116, second transistor 118, and third transistor 122 are all based into the forward active region. In this region of operation, $$V_{BE} = V_T \ln\left(\frac{I_C}{A_E J_S}\right), \quad [2]$$

where $V_{BE}$ is the voltage differential between the base and the emitter of a particular transistor, $V_T$ is the thermal voltage, $I_C$ is the current through the collector of this transistor, $A_E$ is the emitter area of this transistor, and $J_S$ is the saturation current density of this transistor. Assuming $V_{IN} = V_{th}$ and ignoring base currents, the collector current of transistor 116 equals $$I_{C116} = \frac{V_{IN} - V_{be116}}{R_{110}} \quad [3]$$

Similarly, the collector current of transistor 118 equals $$I_{C118} = \frac{V_{IN} - V_{be122}}{R_{112}} \quad [4]$$

Assuming that $V_{be116}$ approximately equals $V_{be122}$, one can combine equations [2], [3], and [4] to obtain $$V_{be118} - V_{be116} = V_T \ln\left(\frac{A_{E118} R_{112}}{A_{E116} R_{110}}\right) \quad [5]$$

The voltage described by equation [5] appears across resistor 114. Again neglecting base currents, the collector current of transistor 118 equals its emitter current, $$I_{C118} = \frac{V_T}{R_{114}} \ln\left(\frac{A_{E118} R_{112}}{A_{E116} R_{110}}\right) \quad [6]$$

Combining equation [3] with equation [6] and evaluating at $V_{IN} = V_{th}$ gives $$V_{th} = V_{be122} + \frac{R_{112}}{R_{114}} V_T \ln\left(\frac{A_{E118} R_{112}}{A_{E116} R_{110}}\right) \quad [7]$$

which is identical to equation [1]. Because the base-emitter voltage of a bipolar junction transistor exhibits a negative temperature coefficient, while the thermal voltage exhibits a positive temperature coefficient, proper selection of resistors and emitter areas will result in a net cancellation of temperature coefficients within equation [7]. The threshold voltage $V_{th}$ at which the output voltage $V_O$ of comparator apparatus 100 switches states can therefore be made substantially independent of temperature. For silicon transistors, this temperature-independent threshold voltage equals approximately 1.22V, a quantity sometimes called the bandgap voltage.

The assumption that $V_{be116} = V_{be122}$ used in deriving equation [5] can be approximately satisfied by selecting the resistances of first impedance 110 and fourth impedance 120 to satisfy the equation $$\frac{R_{110}}{R_{120}} = \frac{A_{E122}}{A_{E116}} \quad [8]$$

Comparator apparatus 100 can be adjusted to produce a threshold voltage larger than the bandgap voltage while ensuring that this threshold voltage remains substantially independent of temperature by adding a first adjusting impedance 128, a second adjusting impedance 130, and a third adjusting impedance 132. The adjusting impedances should satisfy the equation $$\frac{R_{110}}{R_{128}} = \frac{R_{112}}{R_{130}} = \frac{R_{120}}{R_{132}} \quad [9]$$

where $R_{110}$ is the resistance of first impedance 110, $R_{128}$ is the resistance of first adjusting impedance 128, $R_{112}$ is the resistance of second impedance 112, $R_{130}$ is the resistance of second adjusting impedance 130, $R_{120}$ is the resistance of fourth impedance 120, and $R_{132}$ is the resistance of third adjusting impedance $R_{132}$. The insertion of the adjusting impedances changes the formula for the threshold voltage to $$V_{th} = V_{be122}\left(1 + \frac{R_{112}}{R_{130}}\right) + \frac{R_{112}}{R_{114}} V_T \ln\left(\frac{A_{E118} R_{112}}{A_{E116} R_{110}}\right) \quad [10]$$

The inclusion of the adjusting impedances allows the achievement of any desired threshold voltage greater than the bandgap voltage while ensuring that this threshold voltage remains substantially independent of temperature.

Figure 2:
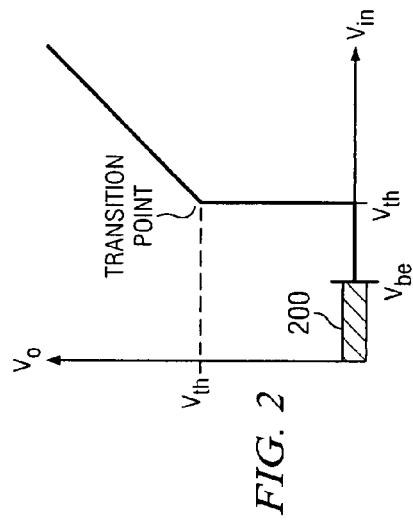
FIG. 2 is a graph illustrating the output characteristic of the example comparator apparatus of FIG. 1.

FIG. 2 is a graph illustrating the output characteristic of the example comparator apparatus 100 of FIG. 1. In region 200, comparator apparatus 100 lacks sufficient voltage to bias fourth transistor 126 into conduction. Current source 124 pulls output voltage $V_O$ high within this region. Once the input voltage $V_{IN}$ exceeds the base-emitter voltage $V_{be}$ of fourth transistor 126, output voltage $V_O$ drops to nearly zero. The output voltage $V_O$ remains nearly zero between $V_{be}$ and the threshold voltage $V_{th}$. The output voltage $V_O$ switches state at approximately $V_{IN}=V_{th}$. The output voltage $V_O$ equals the input voltage $V_{IN}$ for values of the input voltage $V_{IN}$ greater than or equal to $V_{th}$.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claim is:

1. A circuit to compare an input signal with a threshold level, the circuit comprising:
    a Widlar bandgap circuit including:
        a first resistor that receives the input signal;
        a first bipolar transistor that is diode-connect and that is coupled to the first resistor at its collector;
        a second resistor that receives the input signal;
        a second bipolar transistor that is coupled to the base of the first transistor at its base and that is coupled to the second resistor at its collector;
        a third resistor that is coupled to the second transistor at its emitter;
    an intermediate stage coupled with the output of the Widlar bandgap circuit, wherein the intermediate stage includes:
        a fourth resistor that receives the input signal
        a third bipolar transistor that is coupled to the fourth resistor at its collector and that is coupled to the collector of the second bipolar transistor at its base;
    a final stage coupled with the output of the intermediate stage, the final stage to provide an output based on the input signal and the threshold level;
    a fifth resistor that is coupled between the collector of the first bipolar transistor and the ground potential;
    a sixth resistor that is coupled between the that is coupled between the collector of the second bipolar transistor and the ground potential, wherein the ratio of the first resistor to the fifth resistor is approximately equal to the ratio of the second resistor to the sixth resistor.

2. The circuit of claim 1, wherein the final stage includes a transistor switch.

3. The circuit of claim 2, wherein the transistor switch comprises:
    a current source; and
    a transistor having a base coupled with the output of the intermediate stage, a collector coupled with the current source, and an emitter coupled with the ground potential.

4. The circuit of claim 1, wherein the threshold level is a predefined voltage potential.

5. The circuit of claim 1, wherein the final stage is to provide an output when the input signal exceeds the threshold level.

6. The circuit of claim 1, wherein the Widlar bandgap circuit is to output an appreciable current to the intermediate stage when the input signal exceeds the threshold level.

7. The circuit of claim 1, wherein the intermediate stage is to output an appreciable current to the final stage when an appreciable current is not received from the Widlar bandgap circuit.

8. The circuit of claim 1, wherein the circuit further comprises a seventh resistor that is coupled between the collector of the third bipolar resistor and the ground potential, wherein the ratio of the fourth resistor to the seventh resistor is approximately equal to the ratio of the first resistor to the fifth resistor.

* * * * *